United States Patent
Takematsu et al.

(10) Patent No.: US 12,395,199 B2
(45) Date of Patent: Aug. 19, 2025

(54) RADIO-FREQUENCY MODULE AND COMMUNICATION DEVICE

(71) Applicant: Murata Manufacturing Co., Ltd., Kyoto (JP)

(72) Inventors: Yuji Takematsu, Kyoto (JP); Mikiko Fukasawa, Kyoto (JP); Shunji Yoshimi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 359 days.

(21) Appl. No.: 18/311,316

(22) Filed: May 3, 2023

(65) Prior Publication Data

US 2023/0268951 A1 Aug. 24, 2023

Related U.S. Application Data

(63) Continuation of application No. PCT/JP2021/036698, filed on Oct. 4, 2021.

(30) Foreign Application Priority Data

Dec. 14, 2020 (JP) .................... 2020-206538

(51) Int. Cl.
  *H04B 1/52* (2015.01)
  *H04B 1/02* (2006.01)
  *H04B 1/38* (2015.01)

(52) U.S. Cl.
  CPC ............... *H04B 1/38* (2013.01); *H04B 1/02* (2013.01)

(58) Field of Classification Search
  CPC .. H04B 1/38; H04B 1/02; H01L 23/12; H01L 25/00

(Continued)

(56) References Cited

U.S. PATENT DOCUMENTS

2015/0303971 A1* 10/2015 Reisner .................. H04B 1/40
  330/307
2017/0338847 A1  11/2017 Reisner et al.
(Continued)

FOREIGN PATENT DOCUMENTS

JP  2020-027973 A  2/2020
JP  2020-027974 A  2/2020
(Continued)

OTHER PUBLICATIONS

International Search Report for PCT/JP2021/036698 dated Dec. 14, 2021.

*Primary Examiner* — Tanmay K Shah
(74) *Attorney, Agent, or Firm* — McDonald Hopkins LLC

(57) ABSTRACT

A radio-frequency module includes a module substrate having main surfaces facing each other, a first base material at least partially formed of a first semiconductor material, and a second base material at least partially formed of a second semiconductor material having thermal conductivity higher than that of the first semiconductor material and in which a power amplifier circuit is formed. The first base material and the second base material are arranged on the main surface, the second base material is arranged between the module substrate and the first base material, bonded to the first base material, and connected to the main surface with an electrode interposed therebetween, one of the first base material and the second base material is connected to the main surface with an electrode interposed therebetween, and in plan view of the module substrate, an area of the electrode is larger than an area of the electrode.

20 Claims, 9 Drawing Sheets

(58) Field of Classification Search
USPC .................................................. 455/552.1
See application file for complete search history.

(56) References Cited

U.S. PATENT DOCUMENTS

| | | | |
|---|---|---|---|
| 2020/0051941 A1 | 2/2020 | Nakazawa et al. | |
| 2020/0051942 A1 | 2/2020 | Nakazawa et al. | |
| 2020/0051943 A1 | 2/2020 | Nakazawa et al. | |
| 2020/0343172 A1* | 10/2020 | Ino | H01L 23/12 |
| 2021/0226652 A1* | 7/2021 | Matsumoto | H01L 25/00 |

FOREIGN PATENT DOCUMENTS

| | | | |
|---|---|---|---|
| JP | 2020-027975 A | 2/2020 | |
| WO | WO-2018115896 A2 * | 6/2018 | H01Q 23/00 |
| WO | 2020/090557 A1 | 5/2020 | |

* cited by examiner

FIG. 3
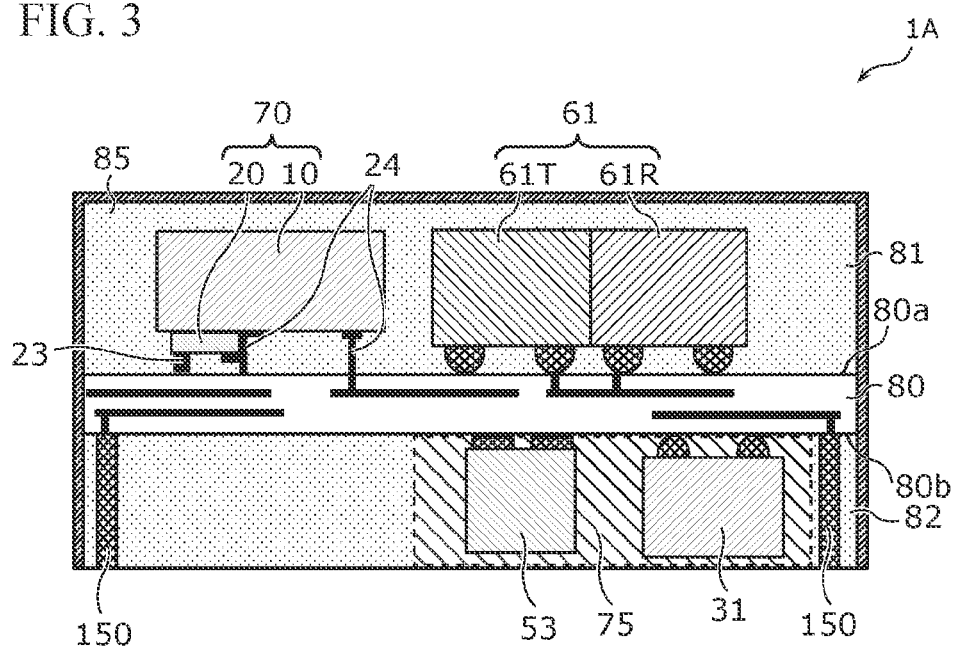
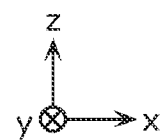

RADIO-FREQUENCY MODULE AND COMMUNICATION DEVICE

CROSS REFERENCE TO RELATED APPLICATION

This is a continuation of International Application No. PCT/JP2021/036698 filed on Oct. 4, 2021, which claims priority from Japanese Patent Application No. 2020-206538 filed on Dec. 14, 2020. The contents of these applications are incorporated herein by reference in their entireties.

BACKGROUND OF THE DISCLOSURE

Field of the Disclosure

The present disclosure relates to a radio-frequency module and a communication device.

Description of the Related Art

In a mobile communication device such as a cellular phone, an arrangement configuration of circuit elements constituting a radio-frequency front-end circuit has become complicated particularly along with development of multi-band technology.

Patent Document 1 discloses a radio-frequency module including a power amplifier and a controller arranged on a package substrate. In the radio-frequency module in Patent Document 1, the power amplifier and the controller are arranged in a stacked manner to achieve a reduction in size of the radio-frequency module.

Patent Document 1: U.S. Patent Application Publication No. 2017/0338847

BRIEF SUMMARY OF THE DISCLOSURE

However, in the radio-frequency module disclosed in Patent Document 1, it is necessary to dissipate the heat generated in the power amplifier through a module substrate (the package substrate), but it may be difficult to ensure sufficient heat dissipation properties.

Thus, the present disclosure provides a radio-frequency module and a communication device with improved heat dissipation properties.

A radio-frequency module according to an aspect of the present disclosure includes a module substrate having a first main surface and a second main surface facing each other, a first base material at least partially formed of a first semiconductor material, and a second base material that is at least partially formed of a second semiconductor material having thermal conductivity higher than that of the first semiconductor material and in which a power amplifier circuit is formed. The first base material and the second base material are arranged on the first main surface, the second base material is arranged between the module substrate and the first base material, bonded to the first base material, and connected to the first main surface with a first metal member interposed therebetween, one of the first base material and the second base material is connected to the first main surface with a second metal member interposed therebetween, and in plan view of the module substrate, an area of the first metal member is larger than an area of the second metal member.

According to the present disclosure, it is possible to provide a radio-frequency module and a communication device with improved heat dissipation properties.

Figure 2A:
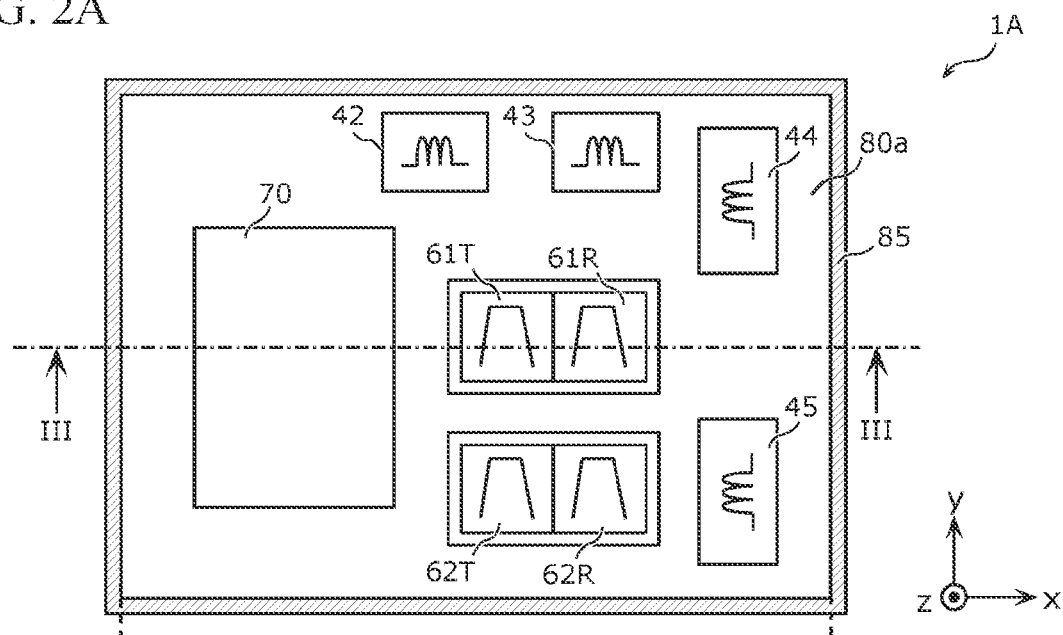
Figure 2B:
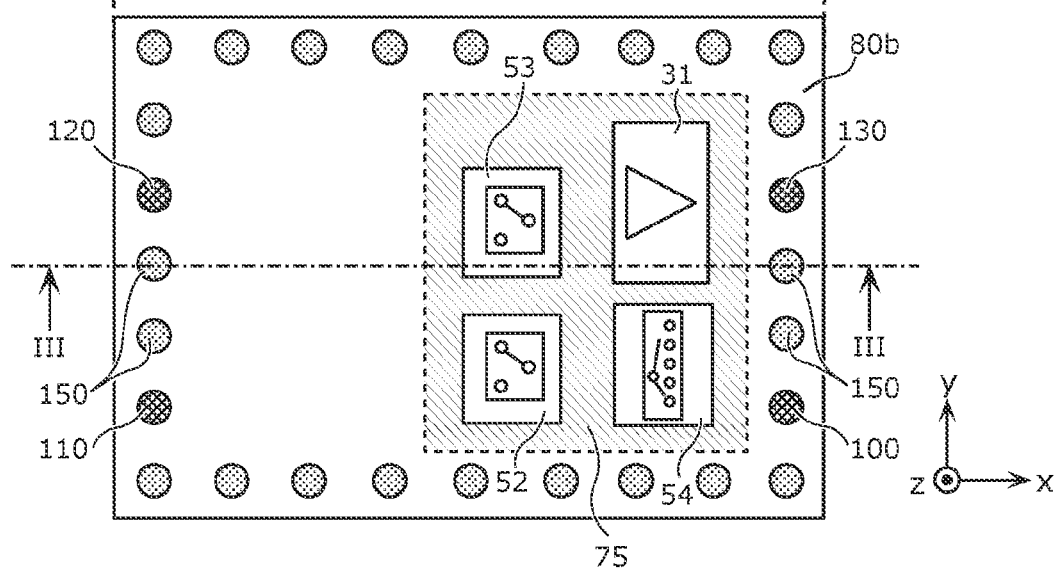

Each of FIGS. 2A and 2B is a planar configuration schematic view of a radio-frequency module according to an example.

FIG. 3 is a sectional configuration schematic view of the radio-frequency module according to the example.

Figure 4:
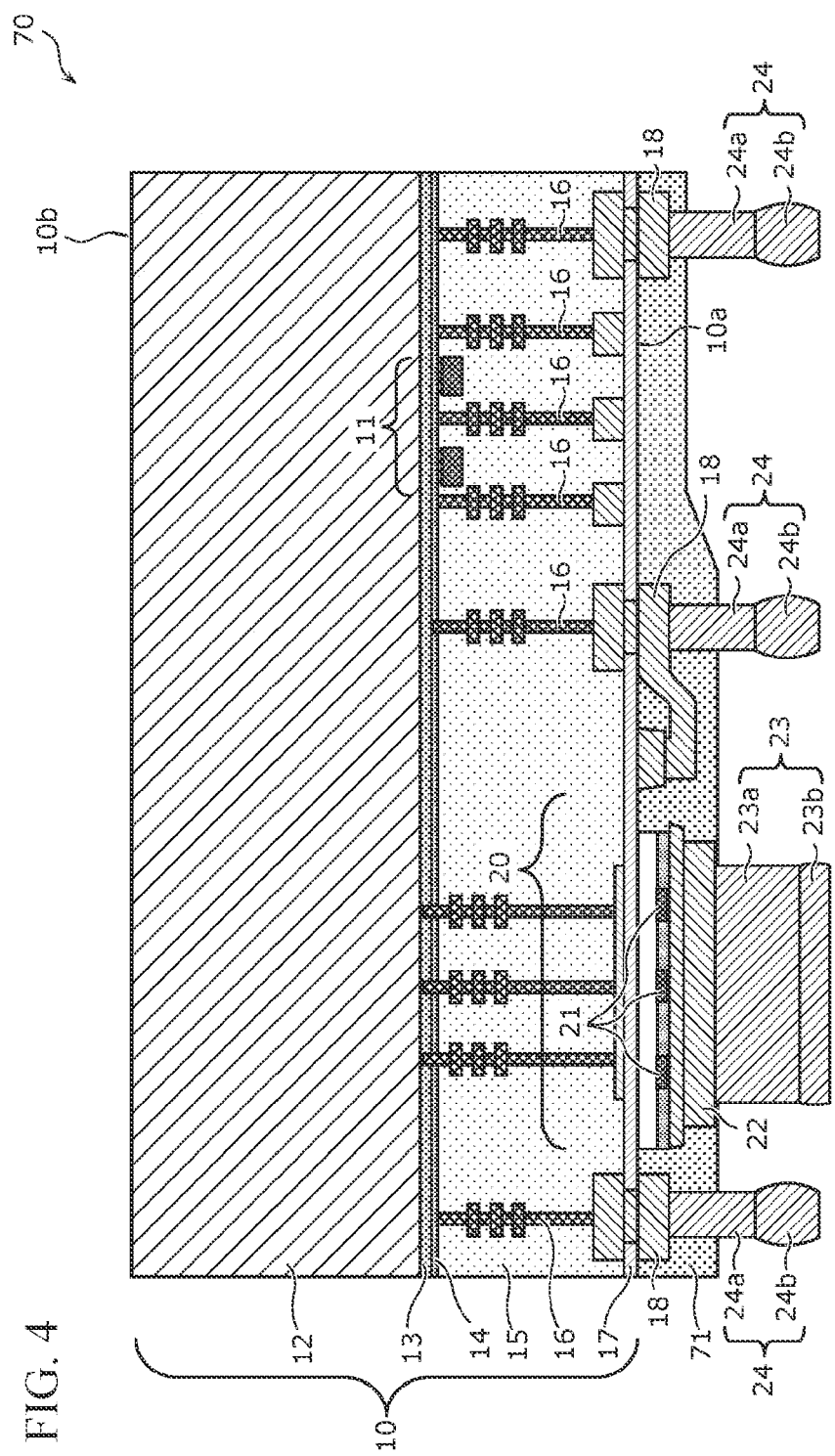

FIG. 4 is a sectional configuration view of a semiconductor IC according to the example.

Figure 5:
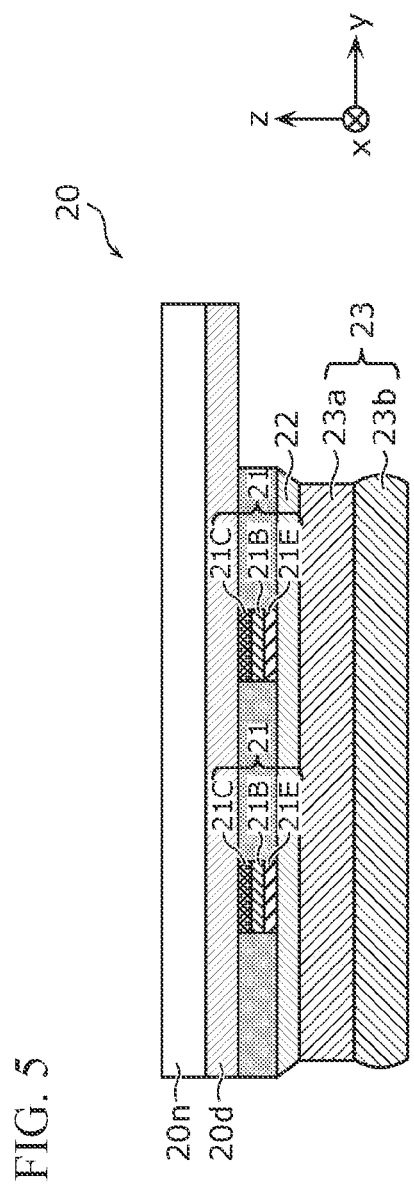

FIG. 5 is a sectional configuration view of a second base material according to the example.

Figure 6:
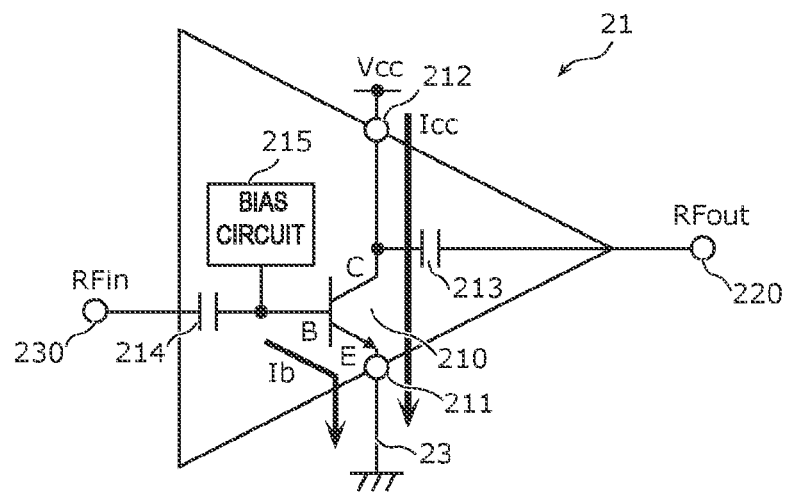

FIG. 6 is a circuit configuration view of a power amplifier circuit according to the example.

Figure 7:
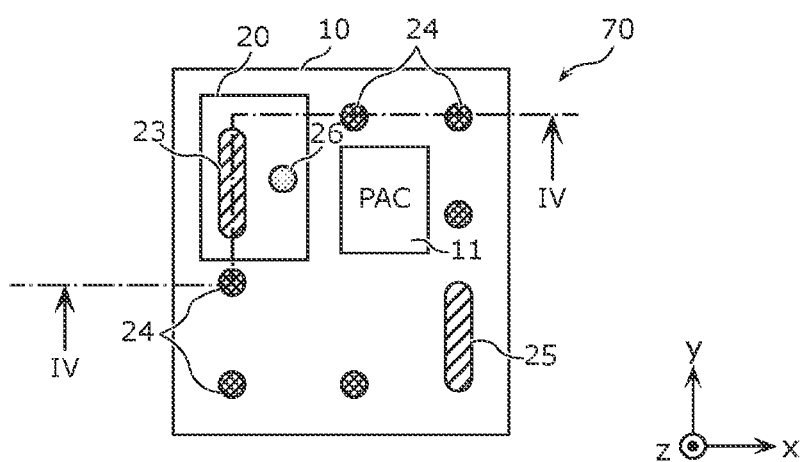

FIG. 7 is a planar configuration schematic view of the semiconductor IC according to the example.

Figure 8A:
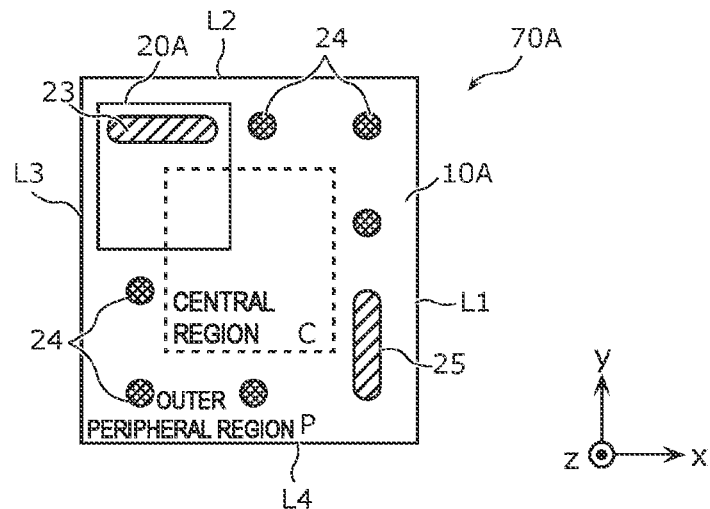

FIG. 8A is a planar configuration schematic view of a semiconductor IC according to Modification 1.

Figure 8B:
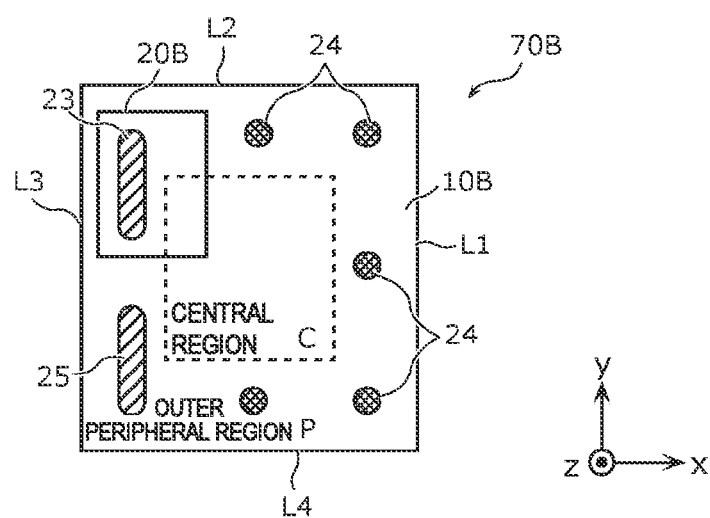

FIG. 8B is a planar configuration schematic view of a semiconductor IC according to Modification 2.

Figure 9:
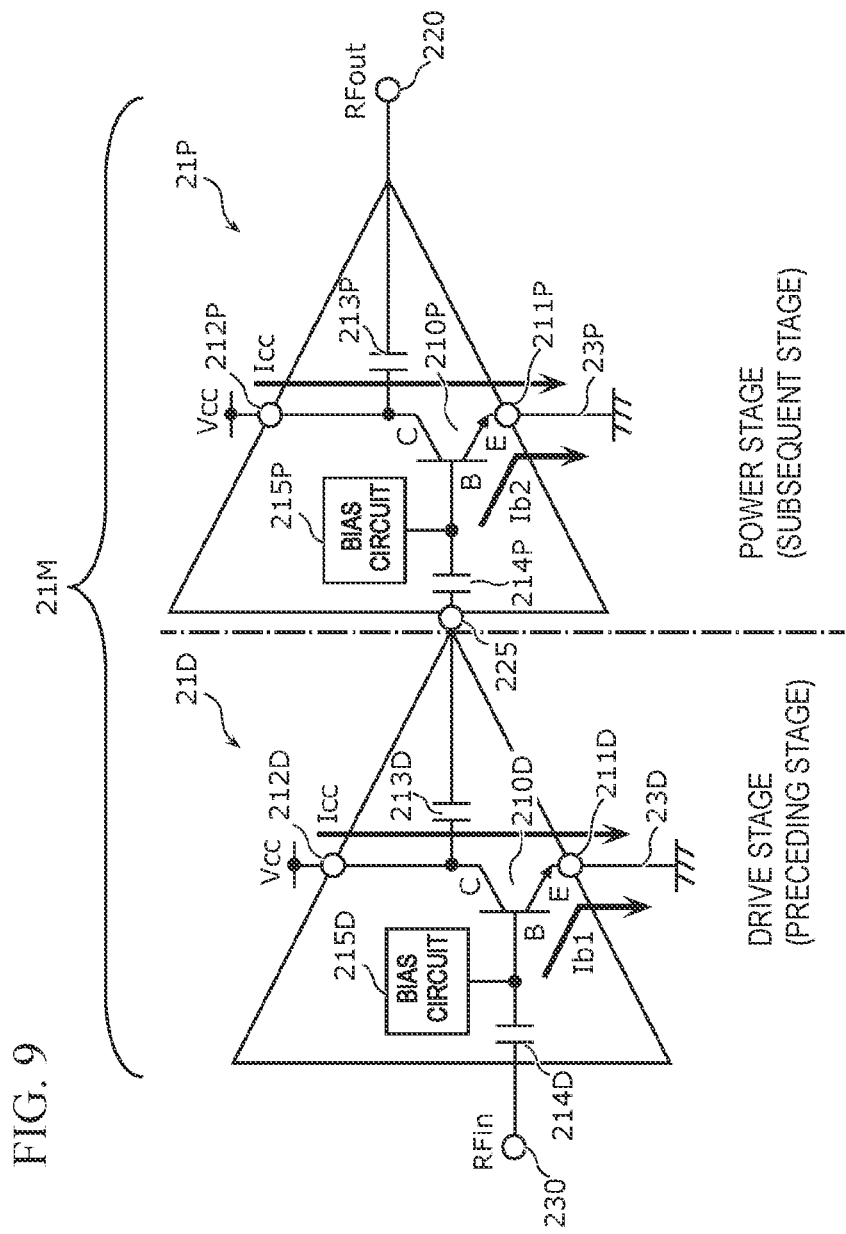

FIG. 9 is a circuit configuration view of a power amplifier circuit according to Modification 3.

Figure 10:
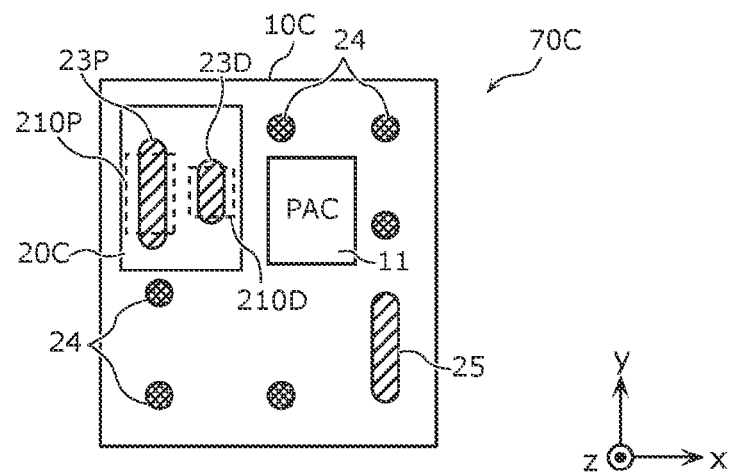

FIG. 10 is a planar configuration schematic view of a semiconductor IC according to Modification 3.

Figure 11:
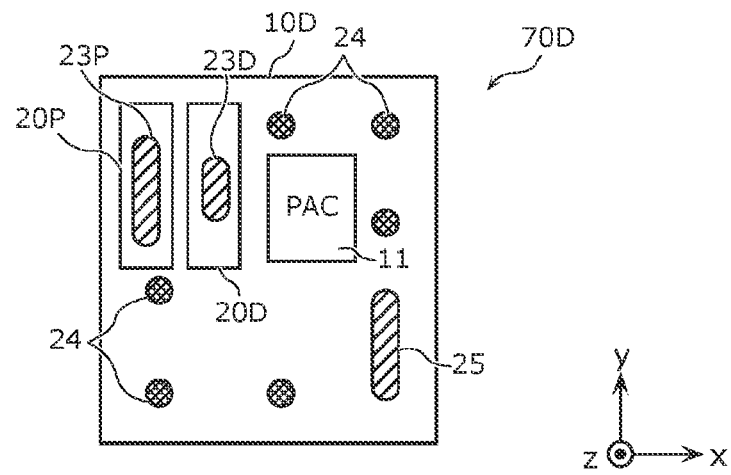

FIG. 11 is a planar configuration schematic view of a semiconductor IC according to Modification 4.

DETAILED DESCRIPTION OF THE DISCLOSURE

Hereinafter, an embodiment of the present disclosure will be described in detail. Note that, any of the embodiments described below illustrates a comprehensive or specific example. Numerical values, shapes, materials, components, arrangements and connection forms of the components, and the like illustrated in the following embodiment are mere examples and are not intended to limit the present disclosure. Among the components in the following examples, components not recited in the independent claims are described as optional components. In addition, sizes or size ratios of the components illustrated in the figures are not necessarily precise. In each figure, substantially the same components are denoted by the same reference numerals, and redundant description may be omitted or simplified.

In addition, in the following description, each of a term indicating a relationship between elements such as parallel and perpendicular, a term indicating a shape of an element such as a rectangular shape, and a numerical range not only represents a strict meaning, but also means that a substantially equivalent range, for example, a difference of about several % is included.

Further, in the following embodiment, "A is arranged on a first main surface of a substrate" means not only that A is directly mounted on the first main surface, but also that, out of a space on a side of the first main surface and a space on a side of the second main surface separated by the substrate, A is arranged in the space on the first main surface side. That is, a case where A is mounted on the first main surface with another circuit element, electrode, or the like interposed therebetween is included.

In addition, in the following embodiment, "A and B are connected to each other" means not only that A and B contact each other but is defined to include a case where A and B are electrically connected to each other with a conductor electrode, a conductor terminal, a wiring line, another circuit component, or the like interposed therebetween. In addition, "connected between A and B" means being connected to both A and B between A and B.

In addition, in the following embodiment, "A and B are bonded to each other" means a state where A and B are mechanically (physically) bonded to each other and is particularly defined to include a case where one surface included in A and one surface included in B are bonded to each other.

In each of the following figures, an x-axis and a y-axis are axes orthogonal to each other on a plane parallel to a main surface of a module substrate. In addition, a z-axis is an axis perpendicular to the main surface of the module substrate, and a positive direction thereof indicates an upward direction, and a negative direction thereof indicates a downward direction.

In addition, in a module configuration of the present disclosure, "in plan view" means that an object is viewed from a positive side of the z-axis by orthographic projection onto an xy plane. "A component is arranged on a main surface of a substrate" includes not only a case where the component is arranged on the main surface in a state of being in contact with the main surface of the substrate, but also a case where the component is arranged above the main surface without being in contact with the main surface, and a case where a part of the component is arranged so as to be embedded in the substrate from a side of the main surface.

Further, in the following, in A, B, and C mounted on a substrate, "C is arranged between A and B in plan view of the substrate (or a main surface of the substrate)" means that at least one of a plurality of line segments linking any point in A to any point in B in plan view of the substrate passes through a region of C. Further, in plan view of a substrate means that the substrate and a circuit element mounted on the substrate are viewed by orthographic projection onto a plane parallel to a main surface of the substrate.

In addition, in the following, a "transmission path" means a transmission line constituted by a wiring line through which a radio-frequency transmission signal propagates, an electrode directly connected to the wiring line, a terminal directly connected to the wiring line or the electrode, and the like. In addition, a "reception path" means a transmission line constituted by a wiring line through which a radio-frequency reception signal propagates, an electrode directly connected to the wiring line, a terminal directly connected to the wiring line or the electrode, and the like.

(Embodiment) [1. Circuit Configuration of Radio-Frequency Module 1 and Communication Device 5]

Figure 1:
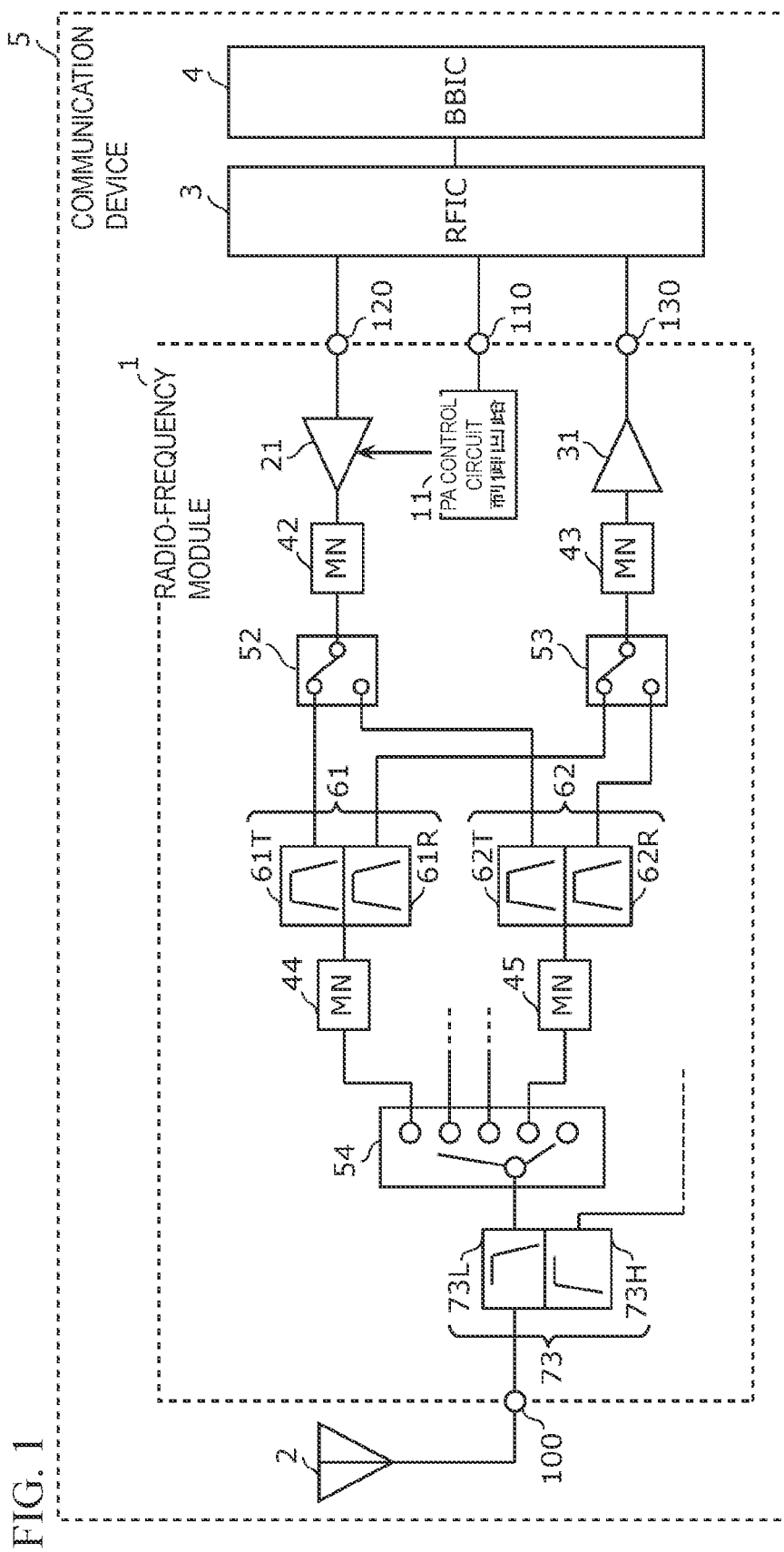
FIG. 1 is a circuit configuration view of a radio-frequency module and a communication device according to an embodiment.

FIG. 1 is a circuit configuration view of a radio-frequency module 1 and a communication device 5 according to an embodiment. As illustrated in the figure, the communication device 5 includes the radio-frequency module 1, an antenna 2, an RF signal processing circuit (RFIC) 3, and a baseband signal processing circuit (BBIC) 4.

The RFIC 3 is an RF signal processing circuit that processes a radio-frequency signal transmitted and received by the antenna 2. To be specific, the RFIC 3 signal-processes a reception signal inputted via a reception path of the radio-frequency module 1 by down-conversion or the like, and outputs the reception signal generated by being signal-processed to the BBIC 4. Further, the RFIC 3 signal-processes a transmission signal inputted from the BBIC 4 by up-conversion or the like, and outputs the transmission signal generated by being signal-processed to a transmission path of the radio-frequency module 1.

The BBIC 4 is a circuit that performs signal processing using an intermediate-frequency band lower than a radio-frequency signal transmitted through the radio-frequency module 1. A signal processed in the BBIC 4 is used, for example, as an image signal for image display or as an audio signal for a call via a speaker.

Further, the RFIC 3 also has a function as a control unit that controls the connections of switches 52, 53, and 54 included in the radio-frequency module 1, based on a communication band (frequency band) to be used. To be specific, the RFIC 3 switches the connections of the switches 52 to 54 included in the radio-frequency module 1 according to a control signal (not illustrated). To be specific, the RFIC 3 outputs a digital control signal for controlling the switches 52 to 54 to a PA control circuit 11. The PA control circuit 11 outputs digital control signals to the switches 52 to 54 according to the digital control signal inputted from the RFIC 3, thereby controlling the connections and the disconnections of the switches 52 to 54.

Further, the RFIC 3 also has a function as a control unit that controls the gain of a power amplifier circuit 21 included in the radio-frequency module 1, and a power supply voltage Vcc and a bias voltage Vbias supplied to the power amplifier circuit 21. To be specific, the RFIC 3 outputs a digital control signal to a control signal terminal 110 of the radio-frequency module 1. The PA control circuit 11 adjusts the gain of the power amplifier circuit 21 by outputting a control signal, the power supply voltage Vcc, or the bias voltage Vbias to the power amplifier circuit 21 according to the digital control signal inputted via the control signal terminal 110. Note that, a control signal terminal for receiving a digital control signal for controlling the gain of the power amplifier circuit 21 from the RFIC 3 may be different from a control signal terminal for receiving a digital control signal for controlling the power supply voltage Vcc and the bias voltage Vbias supplied to the power amplifier circuit 21 from the RFIC 3. Note that, the control unit may be provided outside the RFIC 3 and, for example, may be provided in the BBIC 4.

The antenna 2 is connected to an antenna connection terminal 100 of the radio-frequency module 1, radiates a radio-frequency signal outputted from the radio-frequency module 1, and receives a radio-frequency signal from outside and outputs the radio-frequency signal to the radio-frequency module 1.

Note that, in the communication device 5 according to the present embodiment, the antenna 2 and the BBIC 4 are not essential components.

Next, a detailed configuration of the radio-frequency module 1 will be described.

As illustrated in FIG. 1, the radio-frequency module 1 includes the antenna connection terminal 100, the power amplifier circuit 21, the PA control circuit 11, a low-noise amplifier circuit 31, duplexers 61 and 62, matching circuits 42, 43, 44, and 45, the switches 52, 53, and 54, a diplexer 73, the control signal terminal 110, a transmission input terminal 120, and a reception output terminal 130.

The antenna connection terminal 100 is an example of an input/output terminal and is an antenna common terminal connected to the antenna 2.

The power amplifier circuit 21 is an amplifier circuit that amplifies radio-frequency signals in a first communication band and a second communication band inputted from the transmission input terminal 120. The power amplifier circuit 21 is included in a second base material 20. For example, the second base material 20 is at least partially formed of GaAs.

The power amplifier circuit 21 includes, for example, a heterojunction bipolar transistor (HBT).

The low-noise amplifier circuit 31 is an amplifier circuit that amplifies radio-frequency signals in the first communication band and the second communication band with low noise and outputs the amplified radio-frequency signals to the reception output terminal 130.

The PA control circuit 11 is an example of a control circuit that adjusts the gain of the power amplifier circuit 21, according to a digital control signal or the like inputted via the control signal terminal 110. The PA control circuit 11 is included in a first base material 10, and is constituted by, for example, a complementary metal oxide semiconductor (CMOS). Specifically, the PA control circuit 11 is formed by a silicon on insulator (SOI) process. This makes it possible to manufacture the PA control circuit 11 at low cost. Note that, for example, the first base material 10 is at least partially formed of Si.

The duplexer 61 is constituted by a transmission filter 61T and a reception filter 61R. The duplexer 62 is constituted by a transmission filter 62T and a reception filter 62R.

The transmission filter 61T is connected to an output terminal of the power amplifier circuit 21 with the switch 52 and the matching circuit 42 interposed therebetween and passes a transmission signal in the first communication band therethrough. The transmission filter 61T is arranged on a transmission path linking the transmission input terminal 120 to the antenna connection terminal 100. Further, the transmission filter 62T is connected to the output terminal of the power amplifier circuit 21 with the switch 52 and the matching circuit 42 interposed therebetween and passes a transmission signal in the second communication band therethrough. The transmission filter 62T is connected to the transmission path linking the transmission input terminal 120 to the antenna connection terminal 100.

The reception filter 61R is connected to a reception path linking the reception output terminal 130 to the antenna connection terminal 100 and passes a reception signal in the first communication band therethrough. Further, the reception filter 62R is connected to the reception path linking the reception output terminal 130 to the antenna connection terminal 100 and passes a reception signal in the second communication band therethrough.

Note that, each of the duplexers 61 and 62 may be a single filter that performs transmission by a time division duplex (TDD) method. In this case, a switch for switching between the transmission and the reception is arranged in at least one of a preceding stage and a subsequent stage of the above-described single filter.

The switch 52 has a common terminal and two selection terminals. The common terminal of the switch 52 is connected to the output terminal of the power amplifier circuit 21 with the matching circuit 42 interposed therebetween. One selection terminal of the switch 52 is connected to the transmission filter 61T, and the other selection terminal of the switch 52 is connected to the transmission filter 62T. In this connection configuration, the switch 52 switches between the connection between the power amplifier circuit 21 and the transmission filter 61T and the connection between the power amplifier circuit 21 and the transmission filter 62T. The switch 52 is constituted by, for example, a single-pole double-throw (SPDT) type switch circuit.

The switch 53 has a common terminal and two selection terminals. The common terminal of the switch 53 is connected to an input terminal of the low-noise amplifier circuit 31 with the matching circuit 43 interposed therebetween. One selection terminal of the switch 53 is connected to the reception filter 61R, and the other selection terminal of the switch 53 is connected to the reception filter 62R. In this connection configuration, the switch 53 switches between the connection and the disconnection between the low-noise amplifier circuit 31 and the reception filter 61R and switches between the connection and the disconnection between the low-noise amplifier circuit 31 and the reception filter 62R. The switch 53 is constituted by, for example, an SPDT type switch circuit.

The switch 54 is an example of an antenna switch, is connected to the antenna connection terminal 100 with the diplexer 73 interposed therebetween, and switches (1) between the connection and the disconnection between the antenna connection terminal 100 and the duplexer 61 and (2) between the connection and the disconnection between the antenna connection terminal 100 and the duplexer 62.

The matching circuit 42 is connected between the power amplifier circuit 21 and the transmission filters 61T and 62T, and achieves the impedance matching between the power amplifier circuit 21 and the transmission filter 61T and the impedance matching between the power amplifier circuit 21 and the transmission filter 62T.

The matching circuit 43 is connected between the low-noise amplifier circuit 31 and the reception filters 61R and 62R, and achieves the impedance matching between the low-noise amplifier circuit 31 and the reception filter 61R and the impedance matching between the low-noise amplifier circuit 31 and the reception filter 62R.

The matching circuit 44 is arranged on a path linking the switch 54 to the duplexer 61, and achieves the impedance matching between the antenna 2 and the switch 54, and the duplexer 61. The matching circuit 45 is arranged on a path linking the switch 54 to the duplexer 62, and achieves the impedance matching between the antenna 2 and the switch 54, and the duplexer 62.

The diplexer 73 is an example of a multiplexer and constituted by filters 73L and 73H. The filter 73L is a filter that has a frequency range of a first frequency-band group including the first communication band and the second communication band as a pass band, and the filter 73H is a filter that has a frequency range of another frequency-band group having frequencies different from those of the first frequency-band group as a pass band. One terminal of the filter 73L and one terminal of the filter 73H are commonly connected to the antenna connection terminal 100. Each of the filters 73L and 73H is, for example, an LC filter constituted by at least one of a chip-shaped inductor and capacitor.

Note that, the radio-frequency module 1 according to the present embodiment only needs to have the power amplifier circuit 21 among the circuit components illustrated in FIG. 1.

Further, the low-noise amplifier circuit 31 and the switches 52 to 54 may be formed in a single semiconductor integrated circuit (IC). The above-described semiconductor IC is constituted by, for example, a CMOS. Specifically, the semiconductor IC is formed by an SOI process. Thus, the semiconductor IC can be manufactured at low cost. Note that, the semiconductor IC may be formed of at least one of GaAs, SiGe, and GaN. Thus, it is possible to output a radio-frequency signal having high-quality amplification performance and noise performance.

Here, in the radio-frequency module having the above-described circuit configuration, it is necessary to dissipate the heat generated in the power amplifier circuit, but it is difficult to ensure sufficient heat dissipation properties.

On the other hand, a configuration of the radio-frequency module 1 for which sufficient heat dissipation properties can be ensured will be described below.

[2. Arrangement Configuration of Circuit Elements of Radio-frequency Module 1A According to Example]

Each of FIGS. 2A and 2B is a planar configuration schematic view of a radio-frequency module 1A according to an example. Further, FIG. 3 is a sectional configuration schematic view of the radio-frequency module 1A according to the example, and specifically is a sectional view taken along a line III-III in FIGS. 2A and 2B. Note that, FIG. 2A illustrates a layout of circuit components when, out of main surfaces 80a and 80b facing each other of a module substrate 80, the main surface 80a is viewed from a positive direction side of the z-axis. On the other hand, FIG. 2B is a perspective view illustrating an arrangement of circuit components when the main surface 80b is viewed from the positive direction side of the z-axis. In addition, in FIGS. 2A and 2B, each circuit component is provided with a mark representing a function thereof so that an arrangement relationship among the circuit components can be easily understood, but the radio-frequency module 1A is not provided with the marks actually.

The radio-frequency module 1A according to the example specifically illustrates the arrangement configuration of the circuit elements constituting the radio-frequency module 1 according to the embodiment.

As illustrated in FIGS. 2A and 2B and FIG. 3, the radio-frequency module 1A according to the present example further has, in addition to the circuit configuration illustrated in FIG. 1, the module substrate 80, resin members 81 and 82, an external connection terminal 150, a metal shield layer 85, and a semiconductor IC 70.

The power amplifier circuit 21 and the PA control circuit 11 illustrated in FIG. 1 are included in the semiconductor IC 70.

The module substrate 80 is a substrate having the main surface 80a and the main surface 80b facing each other, and mounted with the circuit components constituting the radio-frequency module 1A. As the module substrate 80, for example, a low temperature co-fired ceramics (LTCC) substrate having stacked structure of a plurality of dielectric layers, a high temperature co-fired ceramics (HTCC) substrate, a component built-in substrate, a substrate having a redistribution layer (RDL), a printed circuit board, or the like is used.

Note that, in the present example, the main surface 80a corresponds to a first main surface, and the main surface 80b corresponds to a second main surface.

Note that, as illustrated in FIG. 2B, the antenna connection terminal 100, the control signal terminal 110, the transmission input terminal 120, and the reception output terminal 130 may be formed on the main surface 80b.

The resin member 81 is arranged on the main surface 80a, and covers some of the circuit components constituting the radio-frequency module 1A and the main surface 80a. The resin member 82 is arranged on the main surface 80b, and covers some of the circuit components constituting the radio-frequency module 1A and the main surface 80b. The resin members 81 and 82 have a function of ensuring reliability such as mechanical strength and moisture resistance of the circuit components constituting the radio-frequency module 1A. Note that, the resin members 81 and 82 are not components essential for the radio-frequency module 1 according to the present embodiment.

The metal shield layer 85 is formed on a surface of the resin member 81 and is set to a ground potential. The metal shield layer 85 is, for example, a metal thin film formed by a sputtering method and is copper, an alloy containing copper, or a stacked body containing copper.

As illustrated in FIGS. 2A and 2B and FIG. 3, in the radio-frequency module 1A according to the present example, the semiconductor IC 70, the duplexers 61 and 62, and the matching circuits 42, 43, 44, and 45 are arranged on the main surface 80a. On the other hand, the low-noise amplifier circuit 31 and the switches 52 to 54 are arranged on the main surface 80b.

Note that, although not illustrated in FIGS. 2A and 2B, wiring lines for connecting the circuit components illustrated in FIG. 1 to each other are formed in the inside of the module substrate 80 and on the main surfaces 80a and 80b. Further, as the above-described wiring line, a bonding wire whose both ends are each bonded to any one of the main surfaces 80a and 80b and the circuit component constituting the radio-frequency module 1A may be used, or a terminal, an electrode, or a wiring line formed on a surface of the circuit component constituting the radio-frequency module 1A may be used.

In addition, in the radio-frequency module 1A according to the present example, a plurality of external connection terminals 150 is arranged on the main surface 80b. The radio-frequency module 1A exchanges electric signals with an external substrate arranged on a negative direction side of the z-axis of the radio-frequency module 1A via the plurality of external connection terminals 150. Further, some of the plurality of external connection terminals 150 are set to a ground potential of the external substrate. On the main surface 80b facing the external substrate, out of the main surfaces 80a and 80b, a circuit component that is difficult to be reduced in height is not arranged, and the low-noise amplifier circuit 31 and the switches 52 to 54 that are easily reduced in height are arranged.

Note that, as illustrated in FIGS. 2A and 2B and FIG. 3, the external connection terminal 150 may be a columnar electrode penetrating the resin member 82 in a z-axis direction, or the external connection terminal 150 may be a bump electrode formed on the main surface 80b. In this case, the resin member 82 on the main surface 80b need not be present.

Further, in the radio-frequency module 1A according to the present example, it is essential that the semiconductor IC 70 is arranged on either of the main surfaces 80a and 80b, and the other circuit components may be arranged on either of the main surfaces 80a and the 80b.

Further, although not illustrated in FIGS. 2A and 2B or FIG. 3, the diplexer 73 may be surface-mounted on either of the main surfaces 80a and 80b or may be built in the module substrate 80.

The semiconductor IC 70 includes the first base material 10 and the second base material 20.

The first base material 10 is at least partially formed of a first semiconductor material. Examples of the first semiconductor material include an elemental semiconductor and, in particular, silicon (Si) or gallium nitride (GaN). That is, in the present example, the first base material 10 is at least partially formed of Si or GaN. Note that, the first semiconductor material is not limited to silicon or gallium nitride. For example, as the first semiconductor material, a material including any one of gallium arsenide, aluminum arsenide (AlAs), indium arsenide (InAs), indium phosphide (InP), gallium phosphide (GaP), indium antimonide (InSb), gallium nitride, indium nitride (InN), aluminum nitride (AlN), silicon, germanium (Ge), silicon carbide (SiC), and gallium oxide (III) ($Ga_2O_3$) or a multi-component mixed crystal material formed of two or more of these materials can be used, but the first semiconductor material is not limited thereto. Note that, in the present example, the PA control circuit 11 is formed in the first base material 10.

The second base material 20 is at least partially formed of a second semiconductor material having thermal conductivity higher than that of the first semiconductor material, and the power amplifier circuit 21 is formed therein. Examples of the second semiconductor material include a compound semiconductor and, in particular, gallium arsenide (GaAs) or silicon germanium (SiGe). That is, in the present example, the second base material 20 is at least partially formed of GaAs or SiGe, and the power amplifier circuit 21 is formed therein. Note that, the second semiconductor material is not limited to gallium arsenide or silicon germanium. For example, as the second semiconductor material, a material including any one of gallium arsenide, aluminum arsenide, indium arsenide, indium phosphide, gallium phosphide, indium antimonide, gallium nitride, indium nitride, aluminum nitride, silicon germanium, silicon carbide, gallium oxide (III), and gallium bismuth (GaBi), or a multi-component mixed crystal material formed of two or more of these materials can be used, but the second semiconductor material is not limited thereto.

As illustrated in FIG. 3, the second base material 20 is arranged between the module substrate 80 and the first base material 10, bonded to the first base material 10, and connected to the main surface 80a with an electrode 23 (first metal member) interposed therebetween.

Hereinafter, the semiconductor IC 70 will be described in detail. As described above, the semiconductor IC 70 includes the first base material 10 and the second base material 20.

FIG. 4 is a sectional configuration view of the semiconductor IC 70 according to the example. Further, FIG. 5 is a sectional configuration view of the second base material 20 according to the example.

As illustrated in FIG. 4, the first base material 10 and the second base material 20 are stacked in the z-axis direction (a direction perpendicular to the main surface 80a).

The first base material 10 includes, for example, a Si substrate 12, an insulating layer 13, a Si layer 14, a wiring layer 15, and a SiN layer 17. The SiN layer 17, the wiring layer 15, the Si layer 14, the insulating layer 13, and the Si substrate 12 are stacked in this order on the main surface 80a.

The Si substrate 12 is formed of, for example, silicon single crystal.

The Si layer 14 is, for example, a layer made of silicon and is a layer on which circuit elements constituting the PA control circuit 11 are formed.

The wiring layer 15 is a layer which is made of, for example, silicon oxide and in which a via wiring line 16 for transmitting a control signal from the PA control circuit 11 to the second base material 20 and the module substrate 80 is formed.

The SiN layer 17 is, for example, a protective layer made of silicon nitride and is a layer for ensuring reliability such as moisture resistance of the first base material 10.

The first base material 10 is connected to the main surface 80a with an electrode 24 (second metal member) extending from the first base material 10 toward the main surface 80a interposed therebetween. The electrode 24 is, for example, constituted by a columnar conductor 24a and a bump electrode 24b, one end of the columnar conductor 24a is bonded to an electrode 18 formed on the SiN layer 17, and the other end is bonded to the bump electrode 24b. The bump electrode 24b is connected to an electrode formed on the main surface 80a.

Accordingly, since the PA control circuit 11 of the first base material 10 can directly exchange radio-frequency signals and digital signals with the module substrate 80, it is possible to reduce a signal transmission loss.

Note that, the first base material 10 only needs to include the Si substrate 12, and the other layers need not be present. Further, the switches 53 and 54 may be included in the first base material 10.

Additionally, as illustrated in FIG. 4, the first base material 10 has main surfaces 10a and 10b facing each other. Note that, the main surface 10b may be in contact with the metal shield layer 85.

Accordingly, the heat generated in the power amplifier circuit 21 of the second base material 20 can be dissipated outside through the first base material 10 and the metal shield layer 85. Thus, the heat dissipation properties of the radio-frequency module 1A are improved.

Additionally, a resin member 71 is arranged on the main surface 10a of the first base material 10. Further, the resin member 71 covers the second base material 20.

Next, as illustrated in FIG. 5, the second base material 20 includes, for example, a GaAs base material layer 20n and an epitaxial layer 20d.

The GaAs base material layer 20n is, for example, a single crystal substrate made of gallium arsenide.

The epitaxial layer 20d is, for example, a layer formed by GaAs being epitaxially grown on the GaAs base material layer 20n.

The power amplifier circuit 21 is formed on, for example, the epitaxial layer 20d.

The GaAs base material layer 20n is bonded to the SiN layer 17 of the first base material 10. That is, the second base material 20 is bonded to the first base material 10.

The second base material 20 is connected to the main surface 80a with the electrode 23 (first metal member) extending from the second base material 20 toward the main surface 80a interposed therebetween. The electrode 23 is constituted by, for example, a columnar conductor 23a and a bump electrode 23b, one end of the columnar conductor 23a is bonded to an electrode 22 formed on a main surface of the second base material 20, and the other end is bonded to the bump electrode 23b. The bump electrode 23b is connected to an electrode formed on the main surface 80a.

Accordingly, since the power amplifier circuit 21 of the second base material 20 can directly exchange signals with the module substrate 80, it is possible to reduce a signal transmission loss.

Further, the power amplifier circuit 21 of the second base material 20 may receive a digital control signal, a DC signal, and the like from the PA control circuit 11 of the first base material 10 via the via wiring line 16.

FIG. 6 is a circuit configuration view of the power amplifier circuit 21 according to the example. As illustrated in the figure, the power amplifier circuit 21 includes an amplifier transistor 210, capacitors 213 and 214, a bias circuit 215, a collector terminal 212, an emitter terminal 211, an input terminal 230, and an output terminal 220.

The amplifier transistor 210, for example, has a collector, an emitter, and a base, is a common-emitter type bipolar transistor, and is an amplifier element that amplifies a radio-frequency current inputted to the base and outputs the amplified current from the collector. Note that, the amplifier transistor 210 may be a field-effect type transistor having a drain (corresponding to the collector), a source (corresponding to the emitter), and a gate (corresponding to the base).

The capacitor 214 is a DC cut capacitance element and has a function of preventing a DC current from leaking to the input terminal 230 due to a DC bias voltage applied from the bias circuit 215 to the base.

The capacitor 213 is a DC cut capacitance element and has a function of removing a DC component of a radio-frequency amplified signal on which a DC bias voltage is superimposed, and the radio-frequency amplified signal from which the DC component is removed is outputted from the output terminal 220.

The bias circuit 215 is connected to the base of the amplifier transistor 210 and has a function of optimizing an operating point of the amplifier transistor 210 by applying the bias voltage to the base.

The emitter terminal 211 is connected to the electrode 23 (first metal member) and is connected to a ground.

According to the above-described circuit configuration of the power amplifier circuit 21, a radio-frequency signal RFin inputted from the input terminal 230 becomes a base current Ib flowing from the base to the emitter of the amplifier transistor 210. The base current Ib is amplified by the amplifier transistor 210 to become a collector current Icc, and a radio-frequency signal RFout corresponding to the collector current Icc is outputted from the output terminal 220. At this time, a large current in which the base current Ib and the collector current Icc are added flows from the emitter terminal 211 to the ground. Thus, in order to improve the heat dissipation properties of the power amplifier circuit 21, it is necessary to improve the heat dissipation properties from the emitter terminal 211 which needs to function as a heat dissipation portion of the amplifier transistor 210.

FIG. 7 is a planar configuration schematic view of the semiconductor IC 70 according to the example. Note that, FIG. 7 is a perspective view illustrating an arrangement of the first base material 10, the second base material 20, the PA control circuit 11, the electrodes 23 and 24, and electrodes 25 and 26, when the main surface 80*a*, out of the main surfaces 80*a* and 80*b* facing each other of the module substrate 80, is viewed from the positive direction side of the z-axis. Note that, FIG. 4 is a sectional view taken along a line IV-IV in FIG. 7.

The electrode 26 is an example of the second metal member and connects the second base material 20 and the main surface 80*a* to each other. The electrode 26 is, for example, the input terminal 230 or the output terminal 220 of the power amplifier circuit 21 and is a signal electrode through which a radio-frequency signal flows.

The electrode 23 is an example of the first metal member and connects the second base material 20 and the main surface 80*a* to each other. The electrode 23 is, for example, a ground electrode connected to the emitter terminal 211 of the power amplifier circuit 21.

The electrode 24 is an example of the second metal member and connects the first base material 10 and the main surface 80*a* to each other. The electrode 24 is, for example, an input terminal or an output terminal of the PA control circuit 11, or a ground electrode.

The electrode 25 is an example of a third metal member and connects the first base material 10 and the main surface 80*a* to each other. The electrode 25 is, for example, a ground electrode of an electronic component formed on the first base material 10.

Here, in plan view of the module substrate 80, an area of the electrode 23 is larger than an area of the electrode 26. Further, the area of the electrode 23 is larger than an area of the electrode 24.

According to the above-described configuration, the heat generated in the power amplifier circuit 21 is promoted to be transferred to the first base material 10 having thermal conductivity higher than that of the second base material 20. At the same time, the heat generated in the power amplifier circuit 21 is dissipated from the second base material 20 to the module substrate 80 through the electrode 23 having a large heat dissipation area. Thus, the heat generated in the power amplifier circuit 21 can be dissipated with high efficiency. Furthermore, since the first base material 10 and the second base material 20 are stacked in the direction perpendicular to the main surface 80*a*, while the radio-frequency module 1A is reduced in size, the heat dissipation properties can be improved.

Additionally, as illustrated in FIG. 7, the electrode 23 has an elongated shape in plan view of the module substrate 80. Accordingly, since electrode density can be increased with the electrode 23, a region on the second base material 20 can be effectively utilized, as compared to a case, for example, where a large area is ensured by discretely arranging a plurality of electrodes, the electrodes having a circular shape like the electrode 26.

Note that, an elongated shape is a shape elongated in one direction, and a longitudinal direction indicates the one direction. More specifically, an elongated shape is a shape in which a length in the one direction is longer than a length in another direction intersecting with the one direction.

Further, in plan view of the module substrate 80, an area of the electrode 25 is larger than the area of the electrode 26. Further, the area of the electrode 25 is larger than the area of the electrode 24.

According to the above-described configuration, the heat of the power amplifier circuit 21 transferred to the first base material 10 is dissipated to the module substrate 80 through the electrode 25 having a large heat dissipation area. Thus, the heat generated in the power amplifier circuit 21 can be dissipated with higher efficiency.

Additionally, as illustrated in FIG. 7, the electrode 25 has an elongated shape in plan view of the module substrate 80. Accordingly, since electrode density can be increased with the electrode 25, a region on the first base material 10 can be effectively utilized, as compared to a case, for example, where a large area is ensured by discretely arranging a plurality of electrodes, the electrodes having a circular shape like the electrode 24.

Additionally, although not illustrated in FIG. 7, the amplifier transistor 210 and the electrode 23 may overlap each other, in plan view of the module substrate 80.

Accordingly, since a heat dissipation path linking the amplifier transistor 210 to the electrode 23 can be shortened, the thermal conductance of the heat dissipation path can be increased, and the heat dissipation properties can be improved.

Additionally, as illustrated in FIG. 5, the amplifier transistor 210 of the power amplifier circuit 21 has, for example, a collector layer 21C, a base layer 21B, and an emitter layer 21E. The collector layer 21C, the base layer 21B, and the emitter layer 21E are stacked in this order on the epitaxial layer 20*d*. That is, in the amplifier transistor, the collector layer 21C, the base layer 21B, and the emitter layer 21E are stacked in this order from a side of the first base material 10.

Additionally, as illustrated in FIG. 4, the second base material 20 may be thinner than the first base material 10. In other words, a thickness of the second base material 20 in a thickness direction (the z-axis direction) may be less than a thickness of the first base material 10 in the thickness direction (z-axis direction).

Accordingly, since the second base material 20 having low thermal conductivity is relatively thin and the first base material 10 having high thermal conductivity is relatively thick, the heat transfer from the second base material 20 to the first base material 10 is promoted and the heat dissipation properties are improved.

In addition, in the radio-frequency module 1A according to the example, the low-noise amplifier circuit 31 and the switches 52 to 54 may be included in a semiconductor IC 75.

Accordingly, the radio-frequency module 1A can be reduced in size.

In addition, in the radio-frequency module 1A according to Example 1, in plan view of the module substrate 80, the low-noise amplifier circuit 31 does not overlap the first base material 10 and the second base material 20.

Accordingly, the power amplifier circuit 21 and the low-noise amplifier circuit 31 are distributed to both sides with the module substrate 80 interposed therebetween, and a large distance can be ensured between the power amplifier circuit 21 and the low-noise amplifier circuit 31. Thus, the isolation between the transmission and the reception can be improved.

[3. Electrode Arrangement Configuration of Semiconductor IC According to Modifications 1 and 2]

Next, an arrangement configuration of the electrodes 23 and 25 will be described.

FIG. 8A is a planar configuration schematic view of a semiconductor IC 70A according to Modification 1. Note that, FIG. 8A is a perspective view illustrating an arrangement of a first base material 10A, a second base material 20A, the electrodes 23 to 25, when the main surface 80a, out of the main surfaces 80a and 80b facing each other of the module substrate 80, is viewed from the positive direction side of the z-axis. The semiconductor IC 70A according to Modification 1 is different from the semiconductor IC 70 according to the example only in an arrangement configuration of the electrodes 23 and 25. Hereinafter, regarding the semiconductor IC 70A according to the present modification, description of the same configuration as that of the semiconductor IC 70 according to the example will be omitted, and a different configuration will be mainly described.

The electrode 23 is an example of the first metal member and connects the second base material 20A and the main surface 80a to each other.

The electrode 25 is an example of the third metal member and connects the first base material 10A and the main surface 80a to each other.

Here, as illustrated in FIG. 8A, in plan view of the module substrate 80, the second base material 20A is included in the first base material 10A, and the first base material 10A has a central region C and an outer peripheral region P located on an outer periphery of the central region C. The electrode 23 is arranged in a region where the second base material 20A and the outer peripheral region P overlap each other such that a longitudinal direction of the electrode 23 is parallel to an outer side L2 closest to the electrode 23 among outer sides of the first base material 10A. Further, the electrode 25 is arranged in the outer peripheral region P such that a longitudinal direction of the electrode 25 is parallel to an outer side L1 closest to the electrode 25 among the outer sides of the first base material 10A.

Note that, in the present embodiment, "A is included in B in predetermined plan view" means that when an object is projected in a direction perpendicular to a predetermined plane, an entire projection region of A overlaps a projection region of B.

In a manufacturing process of mounting the semiconductor IC 70A on the module substrate 80, when the areas of the electrodes 23, 24, and 25 are different from each other, the amounts of solder applied to the electrodes are different from each other, and thus, a distance between each of the electrodes and the main surface 80a increases as the area of the electrode increases. Thus, when the electrodes 23 and 25 having a large area are arranged in the central region C of the semiconductor IC 70A, the semiconductor IC 70A cannot be stably arranged on the module substrate 80.

On the other hand, according to the above-described arrangement configuration of the electrodes 23 and 25, since the electrodes 23 and 25 are arranged in the outer peripheral region P and are each arranged along the closest outer side, it is possible to stably arrange the semiconductor IC 70A on the module substrate 80 in the manufacturing process of mounting the semiconductor IC 70A on the module substrate 80.

Note that, the outer sides to which the electrodes 23 and 25 are closest are not limited to the combination of the outer sides L2 and L1. The outer sides to which the electrodes 23 and 25 are closest may be a combination of the outer side L2 and an outer side L4 facing each other or a combination of L1 and L3.

FIG. 8B is a planar configuration schematic view of a semiconductor IC 70B according to Modification 2. Note that, FIG. 8B is a perspective view illustrating an arrangement of a first base material 10B, a second base material 20B, the electrodes 23 to 25, when the main surface 80a, out of the main surfaces 80a and 80b facing each other of the module substrate 80, is viewed from the positive direction side of the z-axis. The semiconductor IC 70B according to Modification 2 is different from the semiconductor IC 70 according to the example only in an arrangement configuration of the electrodes 23 and 25. Hereinafter, regarding the semiconductor IC 70B according to the present modification, description of the same configuration as that of the semiconductor IC 70 according to the example will be omitted, and a different configuration will be mainly described.

The electrode 23 is an example of the first metal member and connects the second base material 20B and the main surface 80a to each other.

The electrode 25 is an example of the third metal member and connects the first base material 10B and the main surface 80a to each other.

Here, as illustrated in FIG. 8B, in plan view of the module substrate 80, the second base material 20B is included in the first base material 10B, and the first base material 10B has the central region C and the outer peripheral region P located on the outer periphery of the central region C. The electrode 23 is arranged in a region where the second base material 20B and the outer peripheral region P overlap each other such that the longitudinal direction of the electrode 23 is parallel to an outer side L3 closest to the electrode 23 among outer sides of the first base material 10B. Further, the electrode 25 is arranged in the outer peripheral region P such that the longitudinal direction of the electrode 25 is parallel to the outer side L3 closest to the electrode 25 among the outer sides of the first base material 10A.

In the semiconductor IC 70B according to the present modification, unlike the semiconductor IC 70A according to Modification 1, the electrodes 23 and 25 are arranged along the same outer side L3. Also in this configuration, since the electrodes 23 and 25 are arranged in the outer peripheral region P and are arranged along the closest outer side, the semiconductor IC 70B can be stably arranged on the module substrate 80, in a manufacturing process of mounting the semiconductor IC 70B on the module substrate 80.

Note that, in Modification 1 and Modification 2, the electrode arrangement in the case where the electrodes 23 and 25 have an elongated shape has been described. In a case where only the electrode 23 has an elongated shape and the electrode 25 has a circular shape having the same size as the electrode 24, the following arrangement configuration may be employed.

That is, in plan view of the module substrate 80, the second base material 20 is included in the first base material 10, the first base material 10 has the central region C and the outer peripheral region P located on the outer periphery of the central region C, and the electrode 23 is arranged in a region where the second base material 20 and the outer peripheral region P overlap each other such that a longitudinal direction of the electrode 23 is parallel to an outer side closest to the electrode 23 among outer sides of the first base material 10.

Also in this configuration, since the electrode 23 is arranged in the outer peripheral region P and is arranged along the closest outer side, the semiconductor IC 70 can be stably arranged on the module substrate 80 in a manufacturing process of mounting the semiconductor IC 70 on the module substrate 80.

[4. Electrode Arrangement Configuration of Semiconductor IC According to Modifications 3 and 4]

Note that, the power amplifier circuit 21 may have a plurality of amplifier transistors that are cascade-connected to each other.

FIG. 9 is a circuit configuration view of a power amplifier circuit 21M according to Modification 3. The power amplifier circuit 21M according to the present modification is configured to include amplifier transistors at two stages that are cascade-connected to each other. As illustrated in FIG. 9, the power amplifier circuit 21M has a power amplifier 21P and a power amplifier 21D.

The power amplifier 21P includes an amplifier transistor 210P, capacitors 214P and 213P, a bias circuit 215P, a collector terminal 212P, an emitter terminal 211P, a terminal 225, and the output terminal 220.

The amplifier transistor 210P is a first amplifier transistor arranged at a last stage (power stage) of the plurality of amplifier transistors and has, for example, a collector, an emitter, and a base. The amplifier transistor 210P is a common-emitter type bipolar transistor, amplifies a radio-frequency current inputted to the base, and outputs the amplified radio-frequency current from the collector. Note that, the amplifier transistor 210P may be a field-effect type transistor having a drain (corresponding to the collector), a source (corresponding to the emitter), and a gate (corresponding to the base).

The power amplifier 21D includes an amplifier transistor 210D, capacitors 214D and 213D, a bias circuit 215D, a collector terminal 212D, an emitter terminal 211D, the input terminal 230, and the terminal 225.

The amplifier transistor 210D is a second amplifier transistor arranged at a stage (drive stage) preceding the amplifier transistor 210P arranged at the last stage and has, for example, a collector, an emitter, and a base. The amplifier transistor 210D is a common-emitter type bipolar transistor, amplifies a radio-frequency current inputted to the base, and outputs the amplified radio-frequency current from the collector. Note that, the amplifier transistor 210D may be a field-effect type transistor having a drain (corresponding to the collector), a source (corresponding to the emitter), and a gate (corresponding to the base).

The capacitors 214P and 214D have a function similar to that of the capacitor 214. The capacitors 213P and 213D have a function similar to that of the capacitor 213. The bias circuits 215P and 215D are connected to the bases of the amplifier transistors 210P and 210D, respectively, and have a function similar to that of the bias circuit 215.

The emitter terminal 211P is connected to an electrode 23P (the first metal member) and is connected to the ground. Further, the emitter terminal 211D is connected to an electrode 23D (the second metal member) and is connected to the ground.

According to the above-described circuit configuration of the power amplifier circuit 21M according to the present modification, the radio-frequency signal RFin inputted from the input terminal 230 becomes a base current Ib1 flowing from the base to the emitter of the amplifier transistor 210D. The base current Ib1 is amplified by the amplifier transistor 210D to become a collector current Icc1, and a radio-frequency signal corresponding to the collector current Icc1 is outputted from the terminal 225. Further, the radio-frequency signal amplified by the amplifier transistor 210D becomes a base current Ib2 flowing from the base to the emitter of the amplifier transistor 210P via the terminal 225. The base current Ib2 is amplified by the amplifier transistor 210P to become a collector current Icc2, and a radio-frequency signal corresponding to the collector current Icc2 is outputted from the output terminal 220. At this time, a large current in which the base current Ib2 and the collector current Icc2 are added flows from the emitter terminal 211P to the ground. Thus, in order to improve the heat dissipation properties of the power amplifier circuit 21M, it is necessary to improve the heat dissipation properties from the emitter terminal 211P which needs to function as a heat dissipation portion of the amplifier transistor 210P.

FIG. 10 is a planar configuration schematic view of a semiconductor IC 70C according to Modification 3. Note that, FIG. 10 is a perspective view illustrating an arrangement of a first base material 10C, a second base material 20C, the PA control circuit 11, and the electrodes 23D, 23P, 24 and 25, when the main surface 80a, out of the main surfaces 80a and 80b facing each other of the module substrate 80, is viewed from the positive direction side of the z-axis.

The electrode 23D is an example of the second metal member and connects the second base material 20C and the main surface 80a to each other. The electrode 23D is, for example, a ground electrode connected to the emitter terminal 211D of the power amplifier circuit 21M.

The electrode 23P is an example of the first metal member and connects the second base material 20C and the main surface 80a to each other. The electrode 23P is, for example, a ground electrode connected to the emitter terminal 211P of the power amplifier circuit 21M.

The electrode 24 is an example of the second metal member and connects the first base material 10C and the main surface 80a to each other. The electrode 24 is, for example, an input terminal or an output terminal of the PA control circuit 11, or a ground electrode.

The electrode 25 is an example of the third metal member and connects the first base material 10C and the main surface 80a to each other. The electrode 25 is, for example, a ground electrode of an electronic component formed on the first base material 10C.

Here, in plan view of the module substrate 80, an area of the electrode 23P is larger than the area of the electrode 24. Further, the area of the electrode 23P is larger than an area of the electrode 23D.

According to the above-described configuration, the heat generated in the power amplifier circuit 21M is promoted to be transferred to the first base material 10C having thermal conductivity higher than that of the second base material 20C. At the same time, the heat generated in the power amplifier circuit 21M is promoted to be dissipated from the second base material 20C to the module substrate 80 through the electrode 23P having a large heat dissipation area. Thus, the heat generated in the power amplifier circuit 21M can be dissipated with high efficiency. Furthermore, since the first base material 10C and the second base material 20C are stacked in the direction perpendicular to the main surface 80a, while a radio-frequency module is reduced in size, the heat dissipation properties can be improved.

Additionally, as illustrated in FIG. 10, the electrode 23P has an elongated shape in plan view of the module substrate 80. Accordingly, since electrode density can be increased with the electrode 23P, a region on the second base material 20C can be effectively utilized, as compared to a case, for example, where a large area is ensured by discretely arranging a plurality of electrodes, the electrodes having a circular shape like the electrode 24.

In addition, as illustrated in FIG. 10, in plan view of the module substrate 80, the amplifier transistor 210P and the electrode 23P may overlap each other, and the amplifier transistor 210D and the electrode 23D may overlap each other.

Accordingly, since a heat dissipation path linking the amplifier transistor 210P to the electrode 23P can be shortened and a heat dissipation path linking the amplifier transistor 210D to the electrode 23D can be shortened, the thermal conductance of these heat dissipation paths can be increased and the heat dissipation properties can be improved.

FIG. 11 is a planar configuration schematic view of a semiconductor IC 70D according to Modification 4. The semiconductor IC 70D according to the present modification is different from the semiconductor IC 70C according to Modification 3 in that the second base material 20 is constituted by two base materials that are arranged to be spaced apart from each other, that is, a third base material 20D and a fourth base material 20P. Hereinafter, the semiconductor IC 70D according to the present modification will be described focusing on a configuration different from that of the semiconductor IC 70C according to Modification 3.

The semiconductor IC 70D includes the third base material 20D and the fourth base material 20P. A first base material 10D and the third base material 20D are stacked in the z-axis direction (direction perpendicular to the main surface 80a). Further, the first base material 10D and the fourth base material 20P are stacked in the z-axis direction (direction perpendicular to the main surface 80a).

The third base material 20D is at least partially formed of the second semiconductor material having the thermal conductivity higher than that of the first semiconductor material, and the power amplifier circuit 21D is formed therein. The fourth base material 20P is at least partially formed of the second semiconductor material having the thermal conductivity higher than that of the first semiconductor material, and the power amplifier circuit 21P is formed therein.

The third base material 20D is arranged between the module substrate 80 and the first base material 10D, bonded to the first base material 10D, and connected to the main surface 80a with the electrode 23D (second metal member) interposed therebetween.

The fourth base material 20P is arranged between the module substrate 80 and the first base material 10D, bonded to the first base material 10D, and connected to the main surface 80a with the electrode 23P (first metal member) interposed therebetween.

According to the above-described configuration, the heat generated in the power amplifier circuit is promoted to be transferred to the first base material 10D having thermal conductivity higher than that of the third base material 20D. At the same time, the heat generated in the power amplifier circuit is promoted to be dissipated from the third base material 20D to the module substrate 80 through the electrode 23P having a large heat dissipation area. Thus, the heat generated in the power amplifier circuit can be dissipated with high efficiency. Further, since the second base material 20 is constituted by the third base material 20D and the fourth base material 20P that are arranged to be spaced apart from each other, the heat generated in one of the power amplifiers 21D and 21P can be dissipated to the module substrate 80 without being transmitted to the other of the power amplifiers 21D and 21P, and thus the heat dissipation efficiency is improved.

[5. Effects and the Like]

As described-above, the radio-frequency module 1A according to the example includes the module substrate 80 having the main surfaces 80a and 80b facing each other, the first base material 10 at least partially formed of the first semiconductor material, and the second base material 20 that is at least partially formed of the second semiconductor material having the thermal conductivity higher than that of the first semiconductor material and in which the power amplifier circuit 21 is formed. The first base material 10 and the second base material 20 are arranged on the main surface 80a, the second base material 20 is arranged between the module substrate 80 and the first base material 10, bonded to the first base material 10, and connected to the main surface 80a with the electrode 23 interposed therebetween, one of the first base material 10 and the second base material 20 is connected to the main surface 80a with the electrode 24 interposed therebetween, and in plan view of the module substrate 80, the area of the electrode 23 is larger than the area of the electrode 24.

Additionally, the radio-frequency module 1A according to the example includes the module substrate 80 having the main surfaces 80a and 80b facing each other, the first base material 10 at least partially formed of silicon or gallium nitride, and the second base material 20 that is at least partially formed of gallium arsenide or silicon germanium and in which the power amplifier circuit 21 is formed. The first base material 10 and the second base material 20 are arranged on the main surface 80a, the second base material 20 is arranged between the module substrate 80 and the first base material 10, bonded to the first base material 10, and connected to the main surface 80a with the electrode 23 interposed therebetween, one of the first base material 10 and the second base material 20 is connected to the main surface 80a with the electrode 24 interposed therebetween, and in plan view of the module substrate 80, the area of the electrode 23 is larger than the area of the electrode 24.

Accordingly, the heat generated in the power amplifier circuit 21 is promoted to be transferred to the first base material 10 having the thermal conductivity higher than that of the second base material 20. At the same time, the heat generated in the power amplifier circuit 21 is dissipated from the second base material 20 to the module substrate 80 through the electrode 23 having a large heat dissipation area. Thus, the heat generated in the power amplifier circuit 21 can be dissipated with high efficiency. Furthermore, since the first base material 10 and the second base material 20 are stacked in the direction perpendicular to the main surface 80a, while the radio-frequency module 1A is reduced in size, the heat dissipation properties can be improved.

In addition, in the radio-frequency module 1A, the electrode 23 may have an elongated shape in plan view of the module substrate 80.

Accordingly, since electrode density can be increased with the electrode 23, a region on the second base material 20 can be effectively utilized, as compared to a case, for example, where a large area is ensured by discretely arranging a plurality of electrodes, the electrodes having a circular shape like the electrode 24.

In addition, in the semiconductor IC 70A according to Modification 1, in plan view of the module substrate 80, the second base material 20A may be included in the first base material 10A, the first base material 10A may have the central region C and the outer peripheral region P, and the electrode 23 may be arranged in the region where the second base material 20A and the outer peripheral region P overlap each other such that the longitudinal direction of the electrode 23 is parallel to the outer side L2 closest to the electrode among the outer sides of the first base material 10A.

Accordingly, since the electrode 23 is arranged in the outer peripheral region P and is arranged along the closest outer side L2, the semiconductor IC 70A can be stably arranged on the module substrate 80 in the manufacturing process of mounting the semiconductor IC 70A on the module substrate 80.

In addition, in the radio-frequency module 1A, the first base material 10 may be connected to the main surface 80a with the electrode 25 interposed therebetween, and in plan view of the module substrate 80, the area of the electrode 25 may be larger than the area of the electrode 24.

Accordingly, the heat of the power amplifier circuit 21 transferred to the first base material 10 is dissipated to the module substrate 80 through the electrode 25 having a large heat dissipation area. Thus, the heat generated in the power amplifier circuit 21 can be dissipated with higher efficiency.

In addition, in the radio-frequency module 1A, the electrodes 23 and 25 may have an elongated shape in plan view of the module substrate 80.

Accordingly, since electrode density can be increased with the electrodes 23 and 25, a region on the second base material 20 can be effectively utilized, as compared to a case, for example, where a large area is ensured by discretely arranging a plurality of electrodes, the electrodes having a circular shape like the electrode 24.

In addition, in the semiconductor IC 70A according to Modification 1 or the semiconductor IC 70B according to Modification 1, in plan view of the module substrate 80, the second base material 20A (or 20B) may be included in the first base material 10A (or 10B), the first base material 10A (or 10B) may have the central region C and the outer peripheral region P, the electrode 23 may be arranged in the region where the second base material 20A (or 20B) and the outer peripheral region P overlap each other such that the longitudinal direction of the electrode 23 is parallel to the outer side L2 (or L3) closest to the electrode 23 among the outer sides of the first base material 10A (or 10B), and the electrode 25 may be arranged in the outer peripheral region P such that the longitudinal direction of the electrode 25 is parallel to the outer side L1 (or L3) closest to the electrode 25 among the outer sides of the first base material 10A (or 10B).

Accordingly, since the electrodes 23 and 25 are arranged in the outer peripheral region P and are each arranged along the closest outer side, the semiconductor IC 70A (or 70B) can be stably arranged on the module substrate 80 in the manufacturing process of mounting the semiconductor IC 70A (or 70B) on the module substrate 80.

In addition, in the radio-frequency module 1A, the power amplifier circuit 21 may include the amplifier transistor 210, and the amplifier transistor 210 may be connected to the electrode 23.

Accordingly, since the heat generated in the amplifier transistor 210 is dissipated from the second base material 20 to the module substrate 80 through the electrode 23 having a large heat dissipation area, the heat generated in the power amplifier circuit 21 can be dissipated with high efficiency.

In addition, in the radio-frequency module 1A, the amplifier transistor 210 and the electrode 23 may overlap each other, in plan view of the module substrate 80.

Accordingly, since a heat dissipation path linking the amplifier transistor 210 to the electrode 23 can be shortened, the thermal conductance of the heat dissipation path can be increased, and the heat dissipation properties can be improved.

In addition, in the radio-frequency module 1A, the amplifier transistor 210 may have the collector layer 21C, the base layer 21B, and the emitter layer 21E. The collector layer 21C, the base layer 21B, and the emitter layer 21E may be stacked in this order from the first base material 10 side.

In addition, in the radio-frequency module according to Modification 3, the power amplifier circuit 21M may include the plurality of amplifier transistors that are cascade-connected to each other, the plurality of amplifier transistors may have the amplifier transistor 210P arranged at the last stage and the amplifier transistor 210D arranged at the stage preceding the amplifier transistor 210P, and the electrode 23 may be connected to the amplifier transistor 210P.

Accordingly, the heat generated in the power amplifier circuit 21M is promoted to be transferred to the first base material 10C having thermal conductivity higher than that of the second base material 20C. At the same time, the heat generated in the power amplifier circuit 21M is promoted to be dissipated from the second base material 20C to the module substrate 80 through the electrode 23P having a large heat dissipation area. Thus, the heat generated in the power amplifier circuit 21M can be dissipated with high efficiency.

In addition, in the radio-frequency module according to Modification 3, the electrode 25 may be connected to the amplifier transistor 210D.

In addition, in the radio-frequency module according to Modification 3, in plan view of the module substrate 80, the amplifier transistor 210P and the electrode 23 may overlap each other and the amplifier transistor 210D and the electrode 25 may overlap each other.

Accordingly, since a heat dissipation path linking the amplifier transistor 210P to the electrode 23P can be shortened, and a heat dissipation path linking the amplifier transistor 210D to the electrode 23D can be shortened, the thermal conductance of these heat dissipation paths can be increased and the heat dissipation properties can be improved.

In addition, in the semiconductor IC 70D according to Modification 4, the second base material may be constituted by the third base material 20D and the fourth base material 20P that are arranged to be spaced apart from each other, the amplifier transistor 210D may be included in the third base material 20D, and the amplifier transistor 210P may be included in the fourth base material 20P.

Accordingly, since the second base material 20 is constituted by the third base material 20D and the fourth base material 20P that are arranged to be spaced apart from each other, the heat generated in one of the power amplifiers 21D and 21P can be dissipated to the module substrate 80 without being transmitted to the other of the power amplifiers 21D and 21P, and thus the heat dissipation efficiency is improved.

In addition, in the radio-frequency module 1A, the first base material 10 may include the PA control circuit 11 that controls the power amplifier circuit 21.

Accordingly, it is possible to shorten a control wiring line connecting the power amplifier circuit 21 and the PA control circuit 11 to each other.

Further, the radio-frequency module 1A may further include the plurality of external connection terminals 150 arranged on the main surface 80b.

Further, the radio-frequency module 1A may further include the low-noise amplifier circuit 31 arranged on the main surface 80b, and the first base material 10 and the second base material 20 need not overlap the low-noise amplifier circuit 31, in plan view of the module substrate 80.

Accordingly, the power amplifier circuit 21 and the low-noise amplifier circuit 31 are distributed to both sides with the module substrate 80 interposed therebetween, and a large distance can be ensured between the power amplifier circuit 21 and the low-noise amplifier circuit 31. Thus, the isolation between the transmission and the reception can be improved.

Further, the communication device 5 includes the RFIC 3 that processes radio-frequency signals transmitted and received by the antenna 2, and the radio-frequency module 1 that transmits the radio-frequency signals between the antenna 2 and the RFIC 3.

Accordingly, it is possible to provide the communication device 5 with improved heat dissipation properties.

(Other Embodiments and the Like)

Although the radio-frequency module and the communication device according to the embodiment of the present disclosure have been described above with reference to the embodiment, the example, and the modifications, the radio-frequency module and the communication device according to the present disclosure are not limited to the embodiment, the example, and the modifications described above. Other embodiments realized by combining any components in the above-described embodiment, example, and modifications, modifications obtained by applying various modifications conceived by a person skilled in the art to the above-described embodiment, example, and modifications without departing from the gist of the present disclosure, and various devices including the above-described radio-frequency module and communication device are also included in the present disclosure.

For example, in the radio-frequency modules and the communication device according to the above-described embodiment, example, and modifications, another circuit element, wiring line, or the like may be inserted between paths connecting the circuit elements and the signal paths disclosed in the figures to each other.

The present disclosure can be widely used in communication devices such as mobile phones as a radio-frequency module arranged in a multiband front end unit.

1, 1A RADIO-FREQUENCY MODULE
2 ANTENNA
3 RF SIGNAL PROCESSING CIRCUIT (RFIC)
4 BASEBAND SIGNAL PROCESSING CIRCUIT (BBIC)
5 COMMUNICATION DEVICE
10, 10A, 10B, 10C, 10D FIRST BASE MATERIAL
10a, 10b, 80a, 80b MAIN SURFACE
11 PA CONTROL CIRCUIT
12 Si SUBSTRATE
13 INSULATING LAYER
14 Si LAYER
15 WIRING LAYER
16 VIA WIRING LINE
17 SiN LAYER
18, 22, 23, 23D, 23P, 24, 25, 26 ELECTRODE
20, 20A, 20B, 20C SECOND BASE MATERIAL
20d EPITAXIAL LAYER
20D THIRD BASE MATERIAL
20n GaAs BASE MATERIAL LAYER
20P FOURTH BASE MATERIAL
21, 21M POWER AMPLIFIER CIRCUIT
21B BASE LAYER
21C COLLECTOR LAYER
21D, 21P POWER AMPLIFIER
21E EMITTER LAYER
23a, 24a COLUMNAR CONDUCTOR
23b, 24b BUMP ELECTRODE
31 LOW-NOISE AMPLIFIER CIRCUIT
42, 43, 44, 45 MATCHING CIRCUIT
52, 53, 54 SWITCH
61, 62 DUPLEXER
61R, 62R RECEPTION FILTER
61T, 62T TRANSMISSION FILTER
70, 70A, 70B, 70C, 70D, 75 SEMICONDUCTOR IC
71, 81, 82 RESIN MEMBER
73 DIPLEXER
73H, 73L FILTER
80 MODULE SUBSTRATE
85 METAL SHIELD LAYER
100 ANTENNA CONNECTION TERMINAL
110 CONTROL SIGNAL TERMINAL
120 TRANSMISSION INPUT TERMINAL
130 RECEPTION OUTPUT TERMINAL
150 EXTERNAL CONNECTION TERMINAL
210, 210D, 210P AMPLIFIER TRANSISTOR
211, 211D, 211P EMITTER TERMINAL
212, 212D, 212P COLLECTOR TERMINAL
213, 213D, 213P, 214, 214D, 214P CAPACITOR
215, 215D, 215P BIAS CIRCUIT
220 OUTPUT TERMINAL
225 TERMINAL
230 INPUT TERMINAL

The invention claimed is:

1. A radio-frequency module, comprising:
a module substrate having a first main surface and a second main surface facing each other;
a first base material at least partially comprised of a first semiconductor material having a first thermal conductivity; and
a second base material at least partially comprised of a second semiconductor material having a second thermal conductivity higher than the first thermal conductivity, wherein a power amplifier circuit is provided in the second base material,
wherein the first base material and the second base material are arranged on the first main surface,
the second base material is arranged between the module substrate and the first base material, bonded to the first base material, and connected to the first main surface with a first metal member interposed therebetween,
one of the first base material and the second base material is connected to the first main surface with a second metal member interposed therebetween, and
in plan view of the module substrate, a first area of the first metal member is larger than a second area of the second metal member.

2. A radio-frequency module, comprising:
a module substrate having a first main surface and a second main surface facing each other;
a first base material at least partially comprised of silicon or gallium nitride; and
a second base material at least partially comprised of gallium arsenide or silicon germanium, wherein a power amplifier circuit is provided in the second base material,
wherein the first base material and the second base material are arranged on the first main surface,
the second base material is arranged between the module substrate and the first base material, bonded to the first base material, and connected to the first main surface with a first metal member interposed therebetween,
one of the first base material and the second base material is connected to the first main surface with a second metal member interposed therebetween, and
in plan view of the module substrate, a first area of the first metal member is larger than a second area of the second metal member.

3. The radio-frequency module according to claim 1, wherein the first metal member has an elongated shape in plan view of the module substrate.

4. The radio-frequency module according to claim 3, wherein in plan view of the module substrate,
the second base material is included in the first base material, and the first base material has a central region and an outer peripheral region located on an outer periphery of the central region, and
the first metal member is arranged in a region where the second base material and the outer peripheral region overlap each other such that a longitudinal direction of the first metal member is parallel to an outer side closest to the first metal member among outer sides of the first base material.

5. The radio-frequency module according to claim 1, wherein the first base material is connected to the first main surface with a third metal member interposed therebetween, and
in plan view of the module substrate, a third area of the third metal member is larger than the second area of the second metal member.

6. The radio-frequency module according to claim 5, wherein in plan view of the module substrate,
each of the first metal member and the third metal member has an elongated shape.

7. The radio-frequency module according to claim 6, wherein in plan view of the module substrate,
the second base material is included in the first base material, and the first base material has a central region and an outer peripheral region located on an outer periphery of the central region,
the first metal member is arranged in a region where the second base material and the outer peripheral region overlap each other such that a longitudinal direction of the first metal member is parallel to an outer side closest to the first metal member among outer sides of the first base material, and
the third metal member is arranged in the outer peripheral region such that a longitudinal direction of the third metal member is parallel to an outer side closest to the third metal member among the outer sides of the first base material.

8. The radio-frequency module according to claim 1,
wherein the power amplifier circuit includes an amplifier transistor, and
the amplifier transistor is connected to the first metal member.

9. The radio-frequency module according to claim 8,
wherein in plan view of the module substrate, the amplifier transistor and the first metal member overlap each other.

10. The radio-frequency module according to claim 8,
wherein the amplifier transistor has a collector layer, a base layer, and an emitter layer, and
the collector layer, the base layer, and the emitter layer are stacked in an order of the collector layer, the base layer, and the emitter layer from a side of the first base material.

11. The radio-frequency module according to claim 1,
wherein the power amplifier circuit includes a plurality of amplifier transistors cascade-connected to each other,
the plurality of amplifier transistors have
a first amplifier transistor arranged at a last stage of the plurality of amplifier transistors, and
a second amplifier transistor arranged at a stage preceding the first amplifier transistor, and
the first metal member is connected to the first amplifier transistor.

12. The radio-frequency module according to claim 11,
wherein the second metal member is connected to the second amplifier transistor.

13. The radio-frequency module according to claim 12,
wherein in plan view of the module substrate, the first amplifier transistor and the first metal member overlap each other, and the second amplifier transistor and the second metal member overlap each other.

14. The radio-frequency module according to claim 11,
wherein the second base material is constituted by a third base material and a fourth base material, the third base material and the fourth base material being arranged to be spaced apart from each other,
the first amplifier transistor is included in the fourth base material, and
the second amplifier transistor is included in the third base material.

15. The radio-frequency module according to claim 1,
wherein the first base material includes a control circuit configured to control the power amplifier circuit.

16. The radio-frequency module according to claim 1, further comprising:
a plurality of external connection terminals arranged on the second main surface.

17. The radio-frequency module according to claim 1, further comprising:
a low-noise amplifier circuit arranged on the second main surface, wherein in plan view of the module substrate, the first base material and the second base material do not overlap the low-noise amplifier circuit.

18. A communication device, comprising:
an RF signal processing circuit configured to process a radio-frequency signal transmitted by an antenna; and
the radio-frequency module according to claim 1 configured to transmit the radio-frequency signal between the antenna and the RF signal processing circuit.

19. The radio-frequency module according to claim 2, wherein the first metal member has an elongated shape in plan view of the module substrate.

20. The radio-frequency module according to claim 2, wherein the first base material is connected to the first main surface with a third metal member interposed therebetween, and
in plan view of the module substrate, a third area of the third metal member is larger than the second area of the second metal member.

* * * * *